(12) United States Patent
Li

(10) Patent No.: US 8,384,115 B2
(45) Date of Patent: Feb. 26, 2013

(54) BOND PAD DESIGN FOR ENHANCING LIGHT EXTRACTION FROM LED CHIPS

(75) Inventor: Ting Li, Ventura, CA (US)

(73) Assignee: Cree, Inc., Durham, NC (US)

( * ) Notice: Subject to any disclaimer, the term of this patent is extended or adjusted under 35 U.S.C. 154(b) by 638 days.

(21) Appl. No.: 12/185,031

(22) Filed: Aug. 1, 2008

(65) Prior Publication Data
US 2010/0025719 A1 Feb. 4, 2010

(51) Int. Cl.
*H01L 29/22* (2006.01)
(52) U.S. Cl. ............ 257/99; 257/91; 257/E33.006; 257/E33.065
(58) Field of Classification Search .......... 257/91, 257/95, 99, E33.002, E33.005, E33.006, 257/E33.057, E33.065
See application file for complete search history.

(56) References Cited

U.S. PATENT DOCUMENTS

| | | | |
|---|---|---|---|
| 4,824,767 A | 4/1989 | Chambers et al. | 430/314 |
| 4,946,547 A | 8/1990 | Palmour et al. | 156/643 |
| 5,192,987 A | 3/1993 | Khan et al. | 257/183.1 |
| 5,200,022 A | 4/1993 | Kong et al. | 156/612 |
| 5,296,395 A | 3/1994 | Khan et al. | 437/40 |
| RE34,861 E | 2/1995 | Davis et al. | 437/100 |
| 5,563,079 A | 10/1996 | Shin et al. | 438/571 |
| 5,712,175 A | 1/1998 | Yoshida | 438/167 |
| 5,959,316 A | 9/1999 | Lowery | 257/98 |
| 6,316,793 B1 | 11/2001 | Sheppard et al. | 257/103 |
| 6,486,499 B1 | 11/2002 | Krames et al. | 257/81 |
| 6,518,598 B1 | 2/2003 | Chen | |
| 6,642,652 B2 | 11/2003 | Collins et al. | 313/512 |
| 6,657,236 B1 | 12/2003 | Thibeault et al. | 257/98 |
| 6,828,596 B2 | 12/2004 | Steigerwald et al. | 257/99 |
| 6,869,812 B1 | 3/2005 | Liu | |
| 6,885,036 B2 * | 4/2005 | Tarsa et al. | 257/99 |
| 6,888,171 B2 * | 5/2005 | Liu et al. | 257/99 |
| 6,946,309 B2 | 9/2005 | Camras et al. | 438/26 |
| 7,141,825 B2 * | 11/2006 | Horio et al. | 257/79 |
| 7,154,125 B2 | 12/2006 | Koide et al. | 257/95 |
| 7,348,212 B2 | 3/2008 | Schiaffino et al. | 438/106 |
| 7,365,374 B2 | 4/2008 | Piner et al. | 257/189 |
| 7,432,142 B2 | 10/2008 | Saxler et al. | 438/167 |

(Continued)

FOREIGN PATENT DOCUMENTS

| | | |
|---|---|---|
| DE | 2755433 | 6/1979 |
| JP | 4284620 | 10/1992 |

(Continued)

OTHER PUBLICATIONS

Search Report from related European Application No. 09159460.6, dated: Dec. 17, 2009.

(Continued)

*Primary Examiner* — Matthew E Warren
(74) *Attorney, Agent, or Firm* — Koppel, Patrick, Heybl & Philpott

(57) ABSTRACT

An improved bond pad design for increased light extraction efficiency for use in light emitting diodes (LEDs) and LED packages. Embodiments of the present invention incorporate a structure that physically isolates the bond pads from the primary emission surface, forcing the current to flow away from the bond pads first before traveling down into the semiconductor material toward the active region. This structure reduces the amount of light that is generated in the area near the bond pads, so that less of the generated light is trapped underneath the bond pads and absorbed.

12 Claims, 5 Drawing Sheets

U.S. PATENT DOCUMENTS

| | | | |
|---|---|---|---|
| 7,439,166 B1 | 10/2008 | Milosavljevic et al. | 438/577 |
| 7,709,282 B2 | 5/2010 | Fukshima et al. | 438/26 |
| 7,795,623 B2 | 9/2010 | Emerson et al. | 257/79 |
| 2003/0102484 A1 | 6/2003 | Hata et al. | |
| 2003/0218183 A1 | 11/2003 | Micovic et al. | |
| 2005/0147923 A1 | 7/2005 | Sawada | 430/314 |
| 2005/0159009 A1 | 7/2005 | Makiyama et al. | 438/712 |
| 2005/0170574 A1 | 8/2005 | Sheppard et al. | |
| 2006/0081869 A1 | 4/2006 | Lu et al. | 257/99 |
| 2006/0202272 A1 | 9/2006 | Wu et al. | 257/355 |
| 2006/0273335 A1 | 12/2006 | Asahara | |
| 2007/0063215 A1 | 3/2007 | Kohda | |
| 2007/0102715 A1* | 5/2007 | Ko et al. | 257/88 |
| 2007/0111473 A1 | 5/2007 | Furukawa et al. | 438/455 |
| 2007/0145392 A1 | 6/2007 | Haberern et al. | 257/79 |
| 2007/0164321 A1 | 7/2007 | Sheppard et al. | |
| 2007/0262338 A1 | 11/2007 | Higashi et al. | 257/99 |
| 2008/0182369 A1 | 7/2008 | Jeong et al. | 438/172 |
| 2008/0217635 A1 | 9/2008 | Emerson | |
| 2008/0241757 A1 | 10/2008 | Xu et al. | |
| 2008/0251858 A1 | 10/2008 | Ahn et al. | 257/386 |
| 2008/0274431 A1 | 11/2008 | Nozaki et al. | 430/319 |
| 2009/0121241 A1 | 5/2009 | Keller et al. | 257/94 |
| 2009/0140272 A1* | 6/2009 | Beeson et al. | 257/89 |
| 2009/0212307 A1 | 8/2009 | Baur | |
| 2009/0283787 A1* | 11/2009 | Donofrio et al. | 257/98 |
| 2010/0140636 A1 | 6/2010 | Donofrio et al. | 257/98 |

FOREIGN PATENT DOCUMENTS

| | | | |
|---|---|---|---|
| JP | 08111544 A * | 4/1996 | |
| JP | 9129532 | 5/1997 | |
| JP | 2001-308380 | 11/2001 | |
| JP | 2004-266240 | 9/2004 | |
| JP | 2006216933 | 8/2006 | |
| JP | 07073590 | 3/2007 | |
| JP | 2007511065 | 4/2007 | |
| WO | WO 2006128446 A1 | 12/2006 | |
| WO | WO 2007/141763 A1 | 12/2007 | |
| WO | WO 2009/039805 AI | 4/2009 | |

OTHER PUBLICATIONS

Examination Report for European Patent Application No. 09159460.6 dated Aug. 20, 2010.

U.S. Appl. No. 10/881,814, filed Jun. 30, 2004, to Haberern. "Light Emitting Devices Having Current Blocking Structures and Methods of Fabricating Light Emitting Devices Having Current Blocking Structures".

International Search Report and Written Opinion for PCT/US2010/024980 mailed Oct. 6, 2010.

Notice of Reasons for Rejection for Japanese Patent Appl. No. 2009-132243, dated Dec. 16, 2011.

Ho Won Jang et al. "Characterization of Band Bendings on GA-FACE and N-FACE GAN Films Grown by Metalorganic Chemical-Vapor Deposition," Journal of Applied Physics Letters, vol. 80, No. 21, May 27, 2002, pp. 3955-3957.

O. Ambacher et al. "Two-Dimensional Electron Gases Induced by Spontaneous and Piezoelectric Polarization Charges in n- and GA-FACE ALGAN/GAN Heterostructures," Journal of Applied Physics, vol. 85, No. 6, Mar. 15, 1999, pp. 3222-3233.

S. Ruvimov et al. "Microstructure of Ti/Al and Ti/Al/Ni/Au Ohmic Contacts for n-GAN," Applied Physics Letters 69(11), Sep. 9, 1996, pp. 1556-1558.

B. P. Luther et al. "Analysis of a Thin ALN Interfacial Layer in Ti/Al and Pd/Al Ohmic Contacts to n-Type GAN," Appl. Physics Letters 71(26), Dec. 29, 1997, pp. 3859-3861.

Joon Seop Kwak et al. "Crystal-Polarity Dependence of Ti/Al Contacts to Freestanding n-GAN Substrate," Applied Physics Letters, vol. 79, No. 20, Nov. 12, 2001, pp. 3254-3256.

B.P. Luther et al. "Study of Contact Resistivity, Mechanical Integrity, and Thermal Stability of Ti/Al and Ta/Al Ohmic Contacts to n-Type GAN," Journal of Electronic Materials, vol. 27, No. 4 1998, pp. 196-199.

Zhou, H.P. et al. "Temperature Dependence of Refractive Index in InN Thin Films Grown by Reactive Sputtering," Journal of Applied Physics, vol. 96, No. 6, Sep. 15, 2004, pp. 3199-3205.

Wu et al., "Bias-Dependent Performance of High-Power ALGAN/GAN HEMTS," IEDM-2001, Washington DC, Dec. 2-6 2001,pp. 378-380.

Wu Lu, "ALGAN/GAN HEMTS on SIC With Over 100 Ghz Ft and Low Microwave Noise," IEEE Transactions on Electron Devices, vol. 48, No. 3, Mar. 2001, pp. 581-585.

Wu, "30-W/MM GAN HEMTS by Field Plate Optimization," IEEE Electron Device Letters, vol, 25, No. 3, Mar. 2001, pp. 117-119.

Karmalkar et al. "Very High Voltage ALGAN/GAN High Electron Mobility Transistors Using a Field Plate Deposited on a Stepped Insulator," Solid State Electronics 45 (2001) pp. 1645-1652.

Wu et al. "High A1-Content ALGAN/GAN HEMTS on SIC Substrates With Very-High Power Performance," IEEE 1999 Digest, pp. 925-927.

Gaska, "High-Temperature Performance of ALGAN/GAN HFETS on SIC Substrates," IEEE Electron Device Letters, Vol. 18, No. 10, Oct. 1997, pp. 492-494.

Gaska et al., "Electron Transport in ALGAN-GAN Heterostructures Grown on 6H-SIC Substrates," Applied Physics Letters, vol. 72, No. 6, Feb. 1998, pp. 707-709.

Gelmont et al., "Monte Carlo Simulation of Electron Transport in Gallium Nitride," J. Applied Physics, vol. 74, No. 3, Aug. 1993, pp. 1818-1821.

Windisch et al. "Impact of Texture-Enhanced Transmission on High-Efficiency Surface-Textured Light-Emitting Diodes," Applied Physics Letters, vol. 79, No. 15, Oct. 2001, pp. 2315-2317.

Schnitzer et al. "30% External Quantum Efficiency From Surface Textured, Thin-Film Light-Emitting Diodes," Applied Physics Letters, Oct. 18, 1993, vol. 64, No. 16, pp. 2174-2176.

Windisch et al. "Light-Extraction Mechanisms in High-Efficiency Surface-Textured Light-Emitting Diodes," IEEE Journal on Selected Topics in Quantum Electronics, vol. 8, No. 2, Mar./Apr. 2002, pp. 248-255.

Streubel, et al. "High Brightness AlGaInP Light-Emitting Diodes," IEEE Journal on Selected Topics in Quantum Electronics, vol. 8, No. 2, Mar./Apr. 2002, pp. 321-332.

Nichia Corp. White LED, Part No. NSPW300BS.

Nichia Corp. White LED, Part No. NSPW312BS.

Notice of Reasons for Rejection from Japanese Patent Application 2010-534010, dated Jun. 26, 2012.

Office Action from U.S. Appl. No. 12/432,478, dated Nov. 17, 2010.
Response to Office Action from U.S. Appl. No. 12/432,478. filed Mar. 17, 2011.
Office Action from U.S. Appl. No. 11/904,064, dated Apr. 22, 2011.
Response to Office Action from U.S. Appl. No. 11/904,064, filed Jul. 22, 2011.
Office Action from U.S. Appl. No. 12/432,478, dated May 16, 2011.
Office Action from U.S. Appl. No. 12/012,376, dated Jul. 8, 2010.
Response to Office Action from U.S. Appl. No. 12/012,376, filed Sep. 28, 2010.
Office Action from U.S. Appl. No. 12/012,376, dated Dec. 3, 2010.
Response to Office Action from U.S. Appl. No. 12/012,376, filed Jan. 26, 2011.
Office Action from U.S. Appl. No. 12/012,376, dated Feb. 22, 2011.
Response to Office Action from U.S. Appl. No. 12/012,376, filed Mar. 22, 2011.

Grundbacher et al., "Utilization of an Electron Beam Resist Process to Examine the Effects of Asymmetric Gate Recess on the Device Characteristics of AlGaAs/InGaAs PHEMT's." IEEE, vol. 44, No. 12, Dec. 1997.

* cited by examiner

A-A'

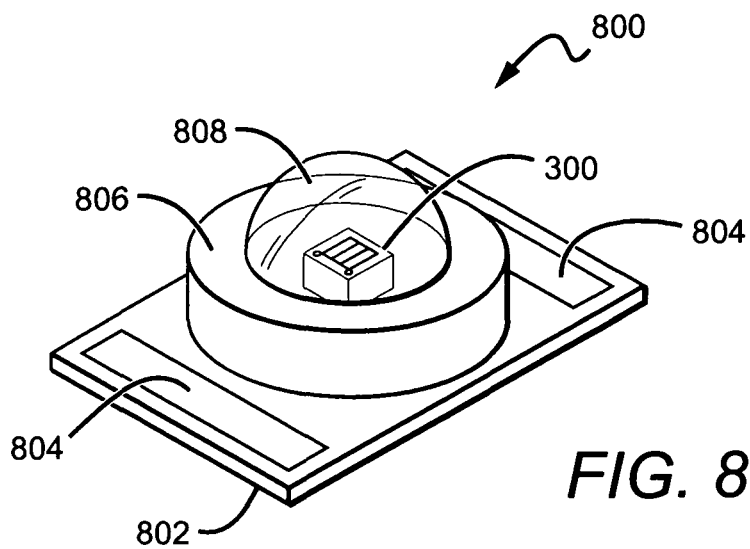
FIG. 8a
FIG. 8b
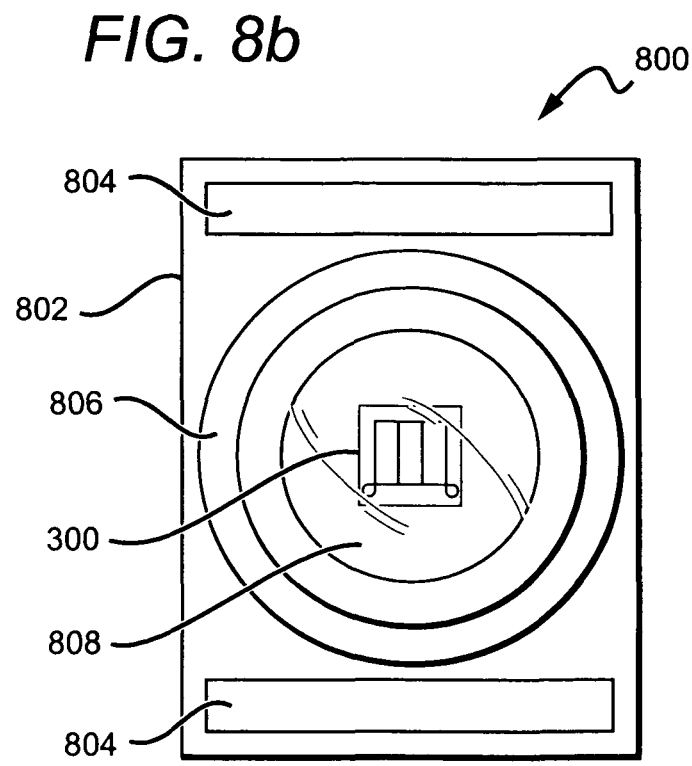

BOND PAD DESIGN FOR ENHANCING LIGHT EXTRACTION FROM LED CHIPS

The invention was made with Government support under Department of Commerce/NIST Contract No. 70NANB4H3037. The Government has certain rights in this invention.

BACKGROUND OF THE INVENTION

1. Field of the Invention

This invention relates to light emitting diodes (LEDs) and, more particularly, to LED chip devices with improved light extraction characteristics.

2. Description of the Related Art

Light emitting diodes (LEDs) are solid state devices that convert electric energy to light and generally comprise an active region of semiconductor material, such as a quantum well, sandwiched between two oppositely doped layers of semiconductor material. When a bias is applied across the doped layers, holes and electrons are injected into the active region where they recombine to generate light. Light is emitted from the active layer and from all surfaces of the LED. Recent advances in LEDs (such as nitride based LEDs) have resulted in highly efficient light sources that surpass the efficiency of filament based light sources while providing a light with equal or greater brightness in relation to input power. This new generation of LEDs is useful in applications requiring a higher intensity light output such as high-power flash lights, airplane lighting systems, fiber-optic communication systems, and optical data storage systems.

Solid state lighting (SSL) packages have been developed having a plurality of LED chips mounted to a package, circuit board, or a heat sink. When a bias is applied to each of the LEDs the SSL package emits the combined light from the LED chips. Some standard LED chips can be fabricated on either thermally or electrically conductive substrates. Electrically conductive substrates typically result in an LED with an active backside mounting pad (metal) and this arrangement is particularly applicable to vertical geometry LED chips. In these embodiments, a bias can be applied to the LEDs through the active backside metal, and through an LED chip contact. In some SSL packages it is desirable to individually control the emission of the LED chips in the package. Individual control using vertical geometry LED chips with active backside mounting pads can require complicated package, circuit board and heat sink design.

Some SSL packages utilize LED chips having high light output characteristics, which results in elevated LED chip operating temperatures. In these SSL packages the LED chips should have low thermal resistance from the heat generating junction of the LED to the SSL package, circuit board and heat sink that allow heat from the LED to conduct away from the LED where it can dissipate. To allow for individual control of the LEDs, it may be desirable for the LED chips to have a mounting option that allows for thermal bonding to the circuit board with a solderable electrically neutral thermal pad that is not used for applying a bias to the LED chip.

Flip-chip LEDs minimize thermal resistance to the package, circuit board and heat sink, but create an electrically active thermal pad below the chip. In other SSL packages, an electrically neutral thermal pad can be created by incorporating a dielectric into the SSL package (e.g. alumina substrates). This, however, substantially increases the packages thermal resistance reducing the LED chip's ability to conduct heat away from the LEDs. Electrically neutral pads can also be created with LEDs grown on electrically insulating substrates, such as sapphire. These types of substrates, however, typically suffer from poor thermal conductivity.

FIG. 1 illustrates a known LED package 100. The top layer of semiconductor material constitutes the primary emission surface 102. The bias is applied to the vertical geometry device via contacts disposed on opposite sides of the device. Bond pads 104 provide a connection for one of the leads, for example a wire bond, on the primary emission surface 102. The other lead is connected to the device on the back side of the package (not shown). The current flows as a result of the voltage differential, and recombination in the active region generates light. A passivation layer 106 covers the sidewalls of the device 100 and an edge portion of the primary emission surface 102. Current spreading conductors 108 help to distribute the current evenly across the entire area of the primary emission surface 102 to make full use of the entire active region beneath.

FIG. 2 shows a cross-sectional view of a portion of device 100 along section line A-A'. A bias is applied across the device as indicated by the positive (+) and negative (−) signs. One of the leads is attached at the bond pad 104; the other lead is attached on the backside of a conductive mount 202. Due to the limited conductivity of the semiconductor material, current $I_c$ tends to crowd near the bond pad 104 where the bias is applied as shown by the current arrows. The high current density around the bond pads 104 causes more light to be generated in portions of the active region 204 near the bond pads 104. Some of the light generated in this area gets trapped underneath the bond pads 104 and ultimately absorbed (as shown by $l_1$), decreasing the light output of the device. Light generated in areas of the active region 202 farther from the bond pad 104 has a much higher probability of escaping the package through the primary emission surface 102 (as shown by $l_2$). Thus, one challenge associated with designing LED packages is extraction efficiency. An efficient design provides all the elements necessary for operation while allowing the maximum amount of light generated in the active region to be emitted.

SUMMARY OF THE INVENTION

One embodiment of a light emitting diode (LED) chip device comprises the following elements. At least one bond pad is disposed on a light emitting semiconductor structure. At least one trench in the semiconductor structure is disposed proximate to at least one edge of said bond pad.

Another embodiment of a light emitting diode (LED) device comprises the following elements. A light emitting semiconductor structure is disposed on a mount surface, with the semiconductor structure comprising a primary emission surface having a generally rectangular shape. The semiconductor structure is shaped to define two peninsular bond pad mount regions in adjacent corners of the primary emission surface. The bond pad mount regions are isolated from the rest of the semiconductor structure by trenches. Two bond pads are disposed, one each, on the bond pad mount regions. A current spreading conductor is disposed on the primary emission surface and in electrical contact with the bond pads, with the current spreading conductor forming a pattern on the primary emission surface.

An embodiment of a light emitting device (LED) package comprises the following elements. An LED chip includes a light emitting semiconductor structure. At least one bond pad is disposed on a primary emission surface of the semiconductor structure. The semiconductor structure is shaped to define trenches that partially surround a portion of the semiconductor structure directly contacting the bond pad. A plurality of current spreading conductors electrically contact the at least one bond pad and the primary emission surface. The LED chip is mounted on a secondary mount. At least two package leads are connected to provide an electrical connection to the LED chip.

BRIEF DESCRIPTION OF THE DRAWINGS

FIGS. 8a and 8b are perspective view and a top plan view, respectively, of an LED package according to an embodiment of the present invention.

DETAILED DESCRIPTION OF THE INVENTION

Figure 1:
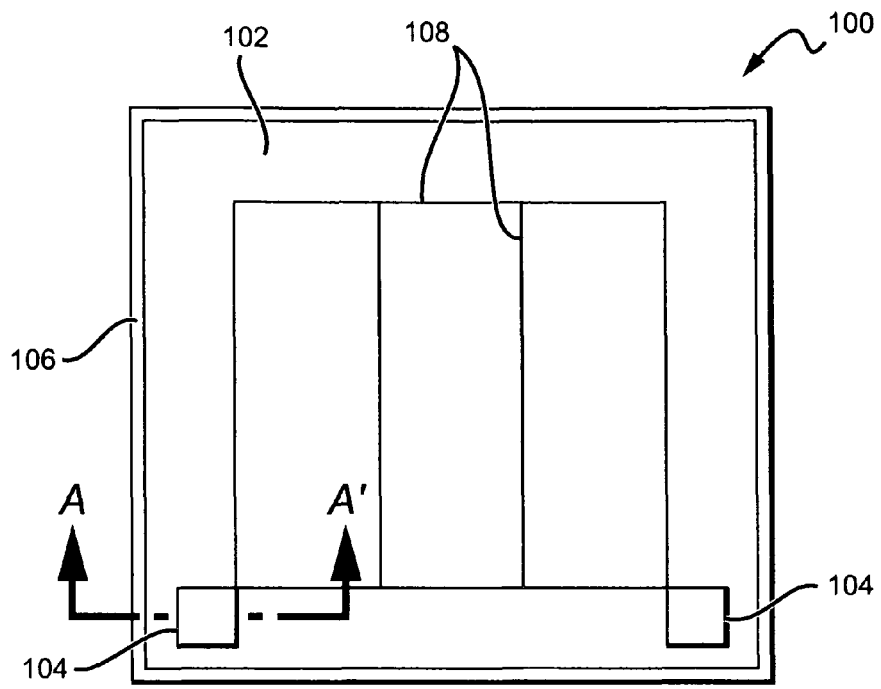
FIG. 1 is top plan view of a known LED chip.
Figure 2:
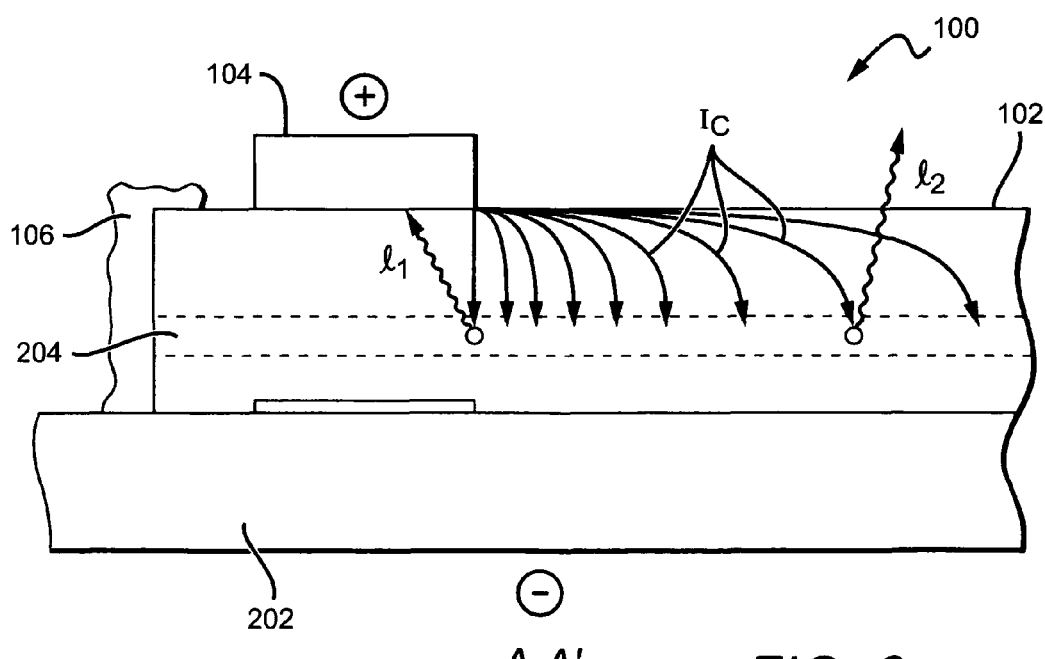
FIG. 2 is a cross-sectional view of a known LED chip along section line A-A' from FIG. 1.

The present invention is directed to LEDs and LED packages having an improved bond pad design for increased light extraction efficiency. Embodiments of the present invention incorporate a structure that physically isolates the bond pads from the primary emission surface, forcing the current to flow away from the bond pads first before flowing down into the semiconductor material toward the active region. This structure reduces the amount of light that is generated in the area near the bond pads, so that less of the light is trapped underneath the bond pads and absorbed. In embodiments where the bond pads cover about 4% of the total surface area of the primary emission surface, it is estimated that the trench structure will increase light output by roughly 4%. Creating the trenches does not require any major changes to the fabrication process, only new masks. Thus, the increase in light output is cost efficient.

It is understood that when an element such as a layer, region or substrate is referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or region to another. It is understood that these terms are intended to encompass different orientations of the device in addition to the orientation depicted in the figures.

Although the ordinal terms first, second, etc., may be used herein to describe various elements, components, regions, layers and/or sections, these elements, components, regions, layers and/or sections should not be limited by these terms. These terms are only used to distinguish one element, component, region, layer or section from another. Thus, a first element, component, region, layer or section discussed below could be termed a second element, component, region, layer or section without departing from the teachings of the present invention.

It is noted that the terms "layer" and "layers" are used interchangeably throughout the application. A person of ordinary skill in the art will understand that a single "layer" of material may actually comprise several individual layers of material. Likewise, several "layers" of material may be considered functionally as a single layer. In other words the term "layer" does not denote an homogenous layer of material. A single "layer" may contain various material concentrations and compositions that are localized in sub-layers. These sub-layers may be formed in a single formation step or in multiple steps. Unless specifically stated otherwise, it is not intended to limit the scope of the invention as embodied in the claims by describing an element as comprising a "layer" or "layers" of material.

Embodiments of the invention are described herein with reference to cross-sectional view and plan view illustrations that are schematic illustrations of idealized embodiments of the invention. As such, variations from the shapes of the illustrations as a result, for example, of manufacturing techniques and/or tolerances are expected. Embodiments of the invention should not be construed as limited to the particular shapes of the regions or elements illustrated herein but are to include deviations in shapes that result, for example, from manufacturing. A region illustrated or described as rectangular, for example, will typically have rounded or curved features due to normal manufacturing techniques. Thus, the regions and elements illustrated in the figures are schematic in nature; their shapes are not intended to illustrate the precise shape of a region and are not intended to limit the scope of the invention. The elements are not drawn to scale relative to each other but, rather, are shown generally to convey spatial and functional relationships.

The term "light" as used herein is not limited to electromagnetic radiation within the visible spectrum. For convenience, "light" may also include portions of the electromagnetic spectrum outside the visible spectrum, such as the infrared or ultraviolet spectra, for example.

Figure 3:
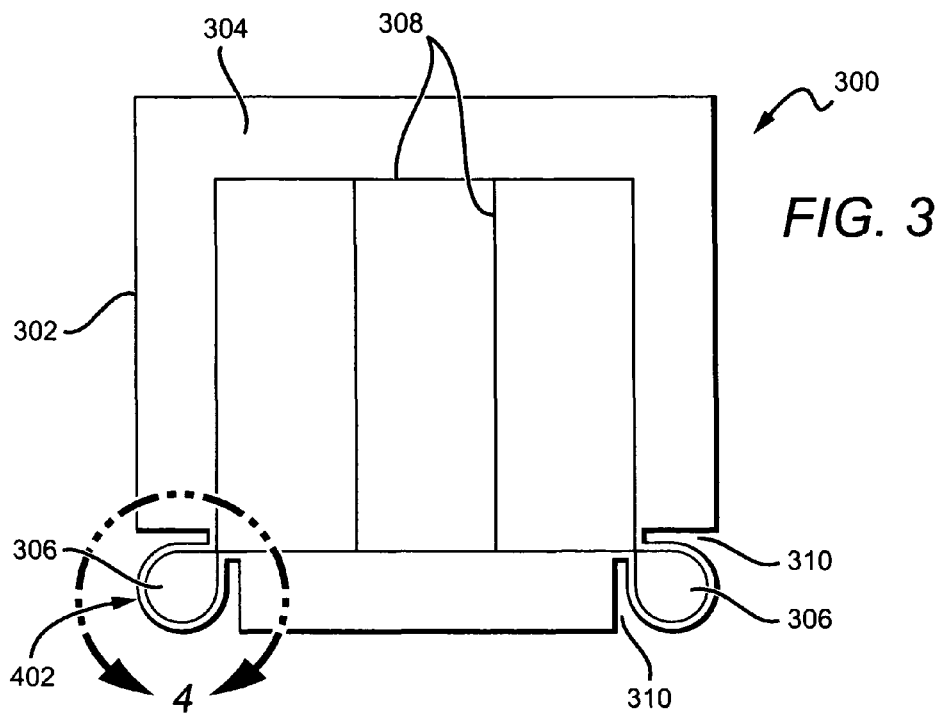
FIG. 3 is a top plan view of an LED chip device according to an embodiment of the present invention.

FIG. 3 illustrates a top plan view of an LED chip device 300 according to an embodiment of the present invention. Layers of semiconductor material are grown to form the semiconductor structure 302. The structure 302 is mounted to a carrier substrate such as silicon or copper, for example, using a wafer bonding or electroplating process. The semiconductor structure 302 may be shaped in many different ways. In this particular embodiment, the semiconductor structure 302 has a substantially rectangular shape. The top surface of the semiconductor structure 302 is the primary emission surface 304. Because the light generated in the active region beneath is emitted through the primary emission surface 304, it is desirable to minimize the area of elements on the surface 304 that might block and/or absorb light before it escapes. However, some surface elements are necessary for the efficient operation of the device.

At least one bond pad 306 is disposed on the semiconductor structure 302. In this particular embodiment, two bond pads 306 are disposed on the primary emission surface 304 to provide a connection for one of the leads from an outside voltage source so that the chip device 300 can be biased. The other lead may be connected to the bottom side of the device 300, for example, opposite the primary emission surface 304. This particular embodiment comprises two bond pads 306 which are located at adjacent corners of the substantially rectangular surface 304. The bond pads 306 may be made out of many conductive materials. Gold, silver and copper are examples of acceptable materials. The bond pads 306 may be shaped in many different ways to accommodate various designs. In this embodiment, the bond pads 306 are substantially circular. The circular shape may allow for simpler manufacturing processes; however, as discussed in more detail below other common shape designs may also be used.

It is necessary to distribute current evenly across the entire surface 304 so that portions of the active region do not go unused. The limited conductivity of the semiconductor material necessitates the use of current spreading conductors 308 to distribute the current across the surface 304. The conductors 308 are disposed on the primary emission surface 304 in a pattern designed to deliver current evenly across the surface 304, especially to areas of the surface 304 that are remote to the bond pads 306. One suitable pattern is a simple grid like the one shown in FIG. 3. Many other patterns may be used to optimize current distribution throughout the device 300. The conductors 308 may be made from any highly conductive material such as gold, silver or copper, for example. The material may be the same or different from the bond pad material.

The conductors 308 are in electrical contact with the bond pads 306. When a bias is applied, current flows from the bond pads 306 out across the primary emission surface 304 via the low-resistance conductors 308. Thus, the current is more evenly spread across surface 304 before it passes into the semiconductor structure 302 toward the active region. Consistent current distribution over the entire active region yields a more uniform emission profile.

The current spreading conductors 308 connect with the bond pads 306 at an isthmus-like area near the corners of the device 300. The bond pads 306 are physically isolated from most of the surrounding areas of the semiconductor structure 302. As shown, the bond pads 306 have a peninsular characteristic. At least one trench 310 separates areas of the semiconductor structure 302 beneath the bond pad 306 from the rest of the semiconductor structure 302. In the embodiment of FIG. 3, trenches 310 on two sides of the bond pads 306 create the separation from the semiconductor structure 302. The trench features 310 are discussed in more detail below with reference to FIGS. 4 and 5. A magnified version of corner region 402 is shown in FIG. 4.

Figure 4:
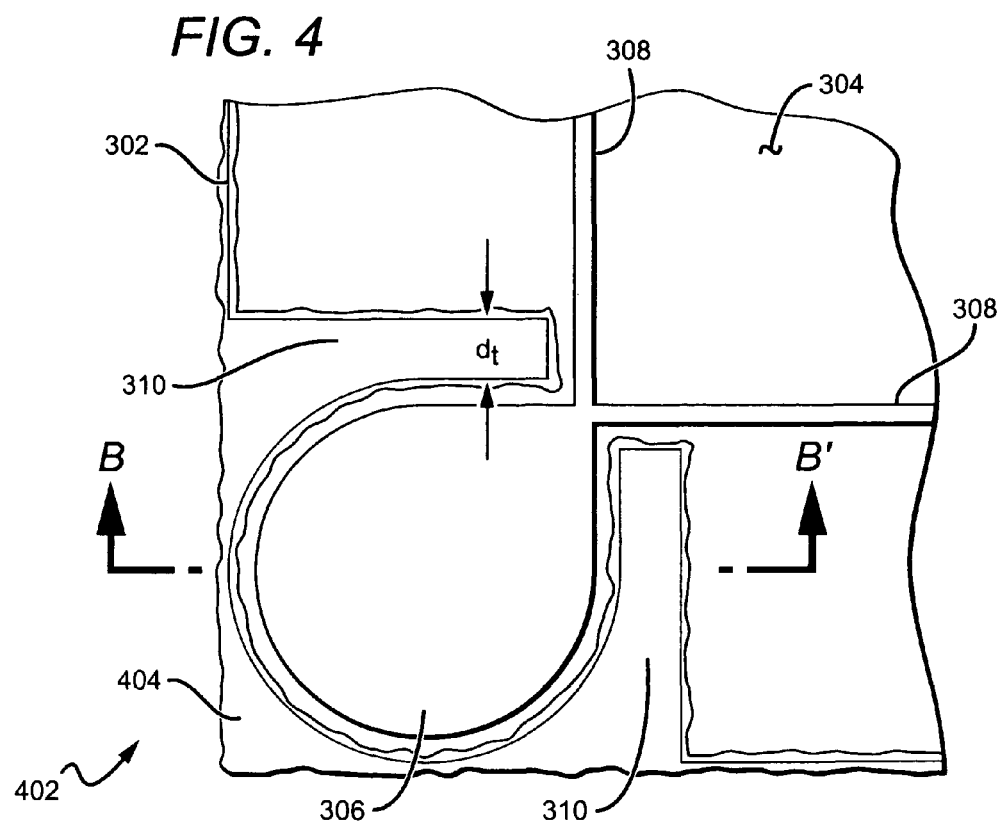
FIG. 4 is a magnified top plan view of a portion of an LED chip device according to an embodiment of the present invention.

FIG. 4 illustrates a magnified top plan view of the corner region 402 of the LED chip device 300. The trenches 310 may be created by known subtractive methods such as etching or ablation, for example. Any precise subtractive method may be used.

As noted above, in this particular embodiment the bond pad 306 is substantially circular, although other embodiments may feature different shapes. The peninsular bond pad 306 protrudes from the main portion of the semiconductor structure 302 as shown. The area of the bond pad 306 may vary but should be large enough to facilitate electrical connection to an outside voltage source. A lead may be attached to the bond pad 306 by wire bonding, for example. When the voltage is applied across the semiconductor structure 302, current will flow from the bond pad 306 through the current spreading conductors 308 across the primary emission surface 304. Because the resistance of the conductors 308 is substantially less than that of the semiconductor structure 302, the current has a better chance of flowing through the conductors 308 to areas of the surface 304 that are remote to the bond pad 306.

A passivation layer 404 is deposited to cover the sidewalls of the semiconductor structure 302 and an edge portion of the primary emission surface 304. The sidewalls of the trenches 310 are also covered by the passivation layer 404 as well as an edge portion of the bond pad 306. The passivation layer 404 protects the sidewalls of the device where the semiconductor layers are exposed, preventing a short across the layers where current could bypass the active region. The passivation layer 404 may be applied using known methods, such as a masking process, for example. Suitable materials for the passivation layer 404 include SiN and silicon dioxide (SiO2). Other passivating materials may also be used.

Figure 5:
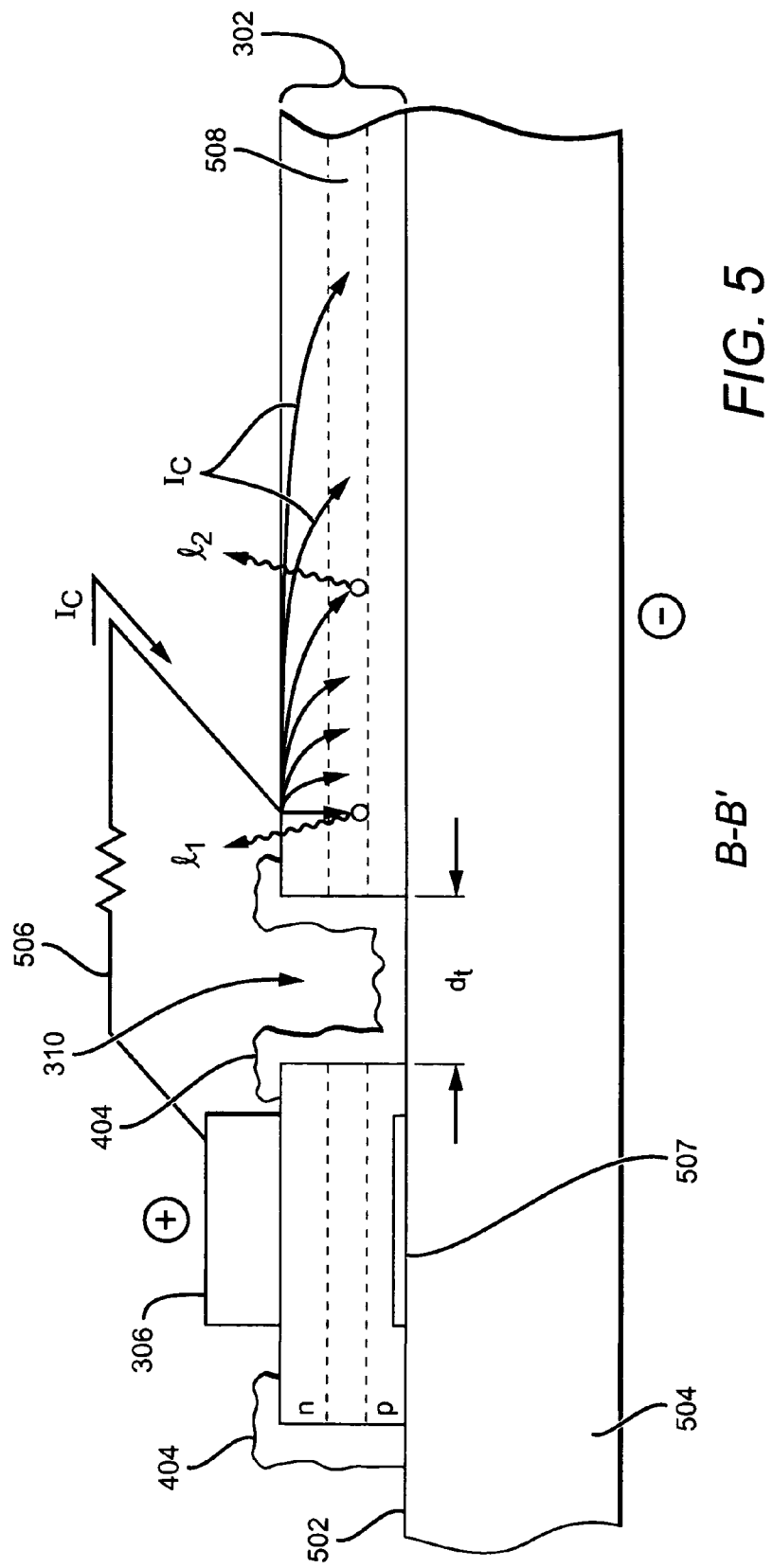
FIG. 5 is a cross-sectional view of a portion of an LED chip device according to an embodiment of the present invention along section line B-B' from FIG. 4.

FIG. 5 illustrates a cross-sectional view of the corner region 402 of the LED chip device 300 along section line B-B'. In this embodiment the bond pad 306 is disposed on the n-type semiconductor material (n) with the p-type material (p) adjacent to the mount surface 502, indicating a flip-chip fabrication process. Other embodiments may have different semiconductor layer arrangements. In a vertical geometry configuration, such as this embodiment, electrical connection may be made to the semiconductor structure 302 opposite the bond pad 306 through the mount surface material. The mount surface 502 may be a silicon carrier wafer, for example. If a carrier wafer is used, a separate p-contact structure may be deposited, or the material used to form the mount surface 502 can itself serve as the p-contact 504 as shown. Here, the polarity of the connections are indicated as positive (+) and negative (−).

Upon application of a bias, a current $I_c$ will flow from the cathode through the device 300 to the anode. The current spreading conductors 308 are not shown in B-B' cross-section of the device 300; electrical connection 506 represents the flow of current $I_c$ through the conductors 308 to the semiconductor structure 302. A current blocking layer 507, discussed in more detail below, is disposed in or proximate to the p-type layer to prevent current from flowing into the area of the directly beneath the bond pad 306. The current $I_c$ carries negative charge carriers through the active region 508 where there is a probability for recombination with a positive carrier (i.e. an electron hole), resulting in the emission of photons such as $l_1$, $l_2$.

The trench 310 physically isolates the bond pad 306, forcing current to flow a distance away from the bond pad 306 before penetrating the semiconductor structure 302 on a path to the active region 508. Although the current spreading conductors 308 help to reduce current crowding, regions of the semiconductor structure 302 nearest to the bond pad 306 still exhibit higher current densities than more remote regions. Due to the high number of carriers in the regions close to the bond pad 306, these areas will also exhibit a higher luminance than other regions. The trench width $d_t$ provides a buffer space between areas of the active region 508 with high rates of recombination and the bond pad 306. The separation reduces the probability that light emitted in these regions (e.g., $l_1$) will get trapped underneath the bond pad 306 and absorbed. Thus, the total light output of the device is increased due to the isolation of the bond pad 306.

A current blocking layer 507 may be disposed beneath the bond pad 306 as shown in FIG. 5. The current blocking layer 507 prevents a significant amount of current from flowing into the areas of the active region 508 between the bond pad 306 and the current blocking layer 507. Current blocking elements may be formed in the semiconductor structure using several techniques, including but not limited to ion implantation, selective oxidation, or processes that selectively damage portions of the semiconductor layers. Various methods of forming current blocking structures are discussed in more detail in US Patent Application Publication No. US2007/0145392 A1 assigned to Cree, Inc.

The sidewalls and edge portions of the semiconductor device 302 and the trench 310 are covered by the passivation layer 404 to protect the exposed semiconductor layers from contamination and short.

Figure 6:
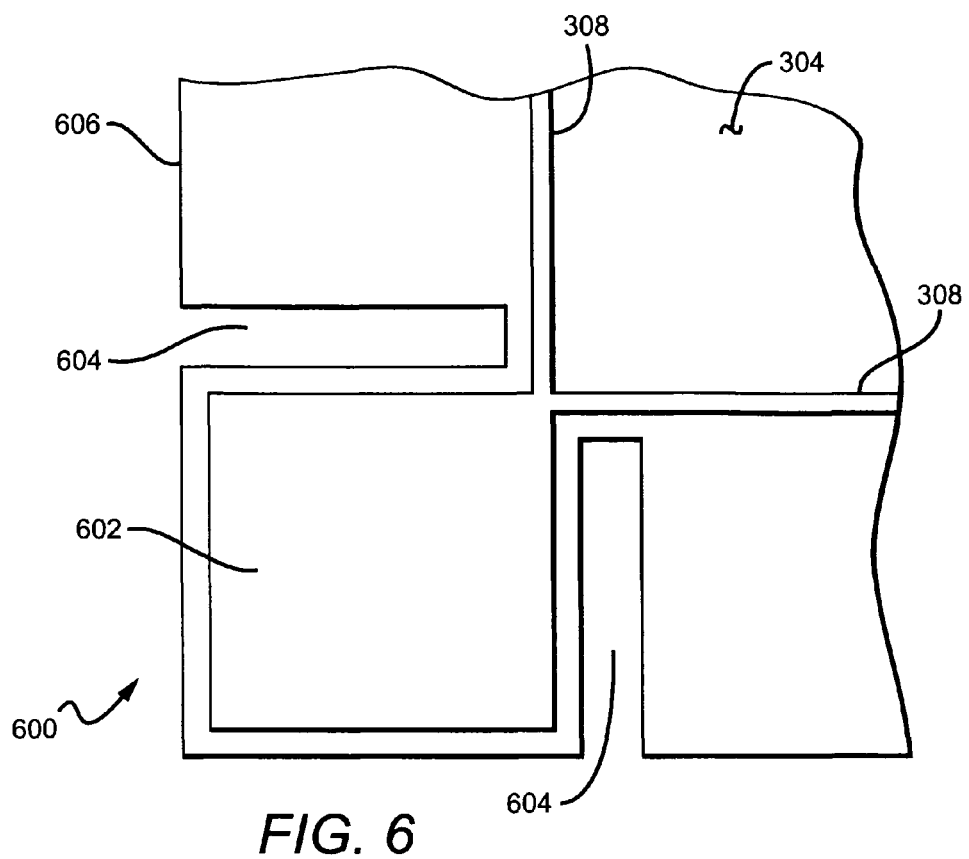
FIG. 6 is a top plan view of a portion of an LED chip device according to an embodiment of the present invention.

FIG. 6 shows another embodiment of a bond pad 602 on a corner of an LED chip device 600. The device 600 shares many common elements with and functions similarly as the device 300 in FIG. 3. The bond pad 602 has a substantially rectangular shape. This design may allow for simple manufacturing processes. One lead may be attached to the bond pad 602 by known means, such as wire bonding for example. The current spreading conductors 308 are electrically connected to the bond pad 602 to deliver current across the primary emission surface 304. Trenches 604 isolate the peninsular bond pad 602 from adjacent portions of the semiconductor structure 606 to increase the light output as discussed in detail above. The shape of the bond pad 602 does not necessarily have to match the shape of the semiconductor structure 606 beneath it. For example, a round bond pad could be used in device 600 without altering the design of the structure 606. Although not shown in FIG. 6, a passivation layer may cover the sidewalls and edge portions of the semiconductor structure 606 and the trenches 604.

Figure 7:
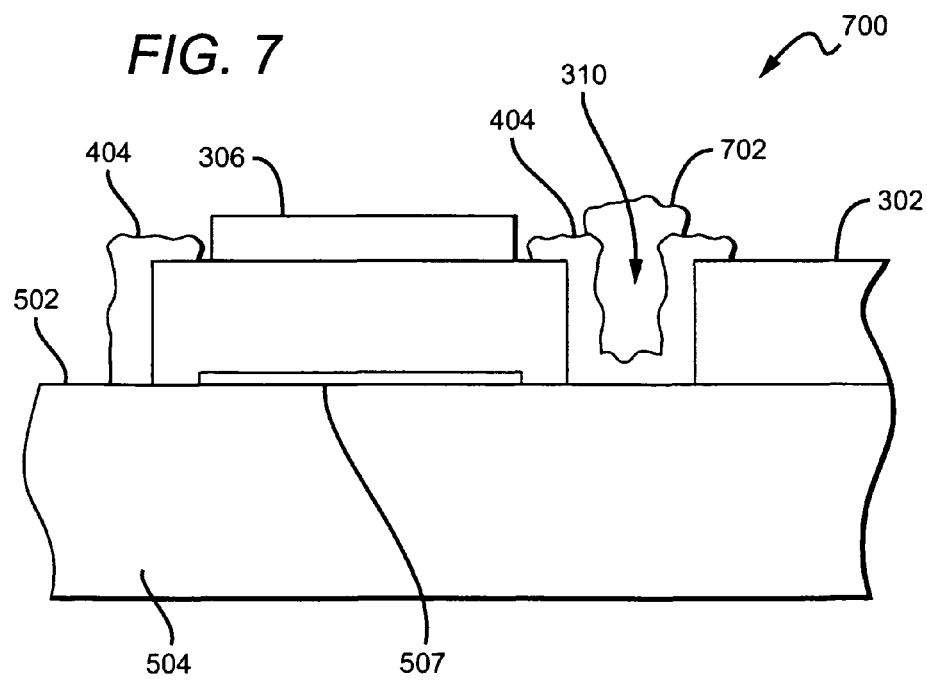
FIG. 7 is a cross-sectional view of a portion of an LED chip device according to an embodiment of the present invention.

FIG. 7 shows a cross-sectional view of another embodiment of a corner portion of LED chip device 700. The device 700 shares several common elements with and functions similarly as the device 300, a portion of which is shown in FIG. 5. In this embodiment, the trench 310 is backfilled with a filler material 702, such as epoxy, for example. Other filler materials may also be used. The filler material 702 prevents foreign substances from getting into the trench 310 and damaging the device 700. The filler material 702 may also provide additional structural support to the portions of the semiconductor structure 302 near the trench 310.

FIGS. 8a and 8b show a perspective view and a top plan view, respectively, of an LED package 800 according to an embodiment of the present invention. The LED package 800 comprises LED chip device 300 which has the peninsular bond pad and trench features discussed in detail above. The LED chip devices described above can be mounted in different LED packages. The package 800 generally comprises a second submount or PCB 802 with package leads 804, with the LED chip device 300 mounted on the PCB 802 and electrically connected to the package leads 804 with, for example, wire bonds from the package leads 804 to the bond pads 310 and the p-contact 504, respectively. In some embodiments a reflector cup assembly ("reflector cup") 806 can also be mounted on the PCB 802. Secondary optics, such as a lens 808 can be placed over the LED chip device 300, and in the embodiment shown, the lens 808 can be mounted directly on LED chip device 300. Light from the device 300 passes primarily through the lens 808 with at least some of the light emitted laterally being reflected by the reflector cup 806 to contribute to useful emission from the package 800. Space between the bottom of the lens 808 and the remainder of the package 800 can be filled with an encapsulating material such as a liquid silicone gel (not shown). Many different lenses and encapsulating materials can be used in the packages according to the present invention to provide different output characteristics.

In LED packages utilizing conventional coating methods such as the "glob" method or electrophoretic deposition (EPD), much of the area within the reflective cup 806 can be covered by a wavelength conversion material and its binder, including the LED chip device 300, the surface of the substrate, and the surfaces of the reflective cup 806. Utilizing LED chip devices fabricated according to the present invention, the phosphor/binder coating is confined to the LED chip device with the other surfaces remaining uncovered. The LED package 800 can also compensate for emission of unconverted light around the edges of the LED package, by reflecting the unconverted light to mix with the converted light.

It is understood that embodiments of LED chip devices according to the present invention can be mounted in many different packages. In one alternative embodiment, the LED chip device is mounted on a PCB and the lens is molded over the LED chip. A reflective cup may be included, but some embodiments will be provided without it.

Although the present invention has been described in detail with reference to certain preferred configurations thereof, other versions are possible. For example with reference to FIG. 8, many different LED chip devices according to embodiments of the present invention may be included in packages similar to package 800. These packages may include many different combinations of various LED package features known in the art. Therefore, the spirit and scope of the invention should not be limited to the versions described above.

I claim:

1. A light emitting diode (LED) chip device, comprising: a light emitting semiconductor structure; at least one bond pad disposed on said semiconductor structure; and wherein said semiconductor structure is shaped to define at least one trench proximate to an edge of said bond pad and substantially separating areas of said semiconductor structure beneath said bond pad from the rest of said semiconductor structure; wherein each layer of said semiconductor structure beneath said bond pad is contiguous with a corresponding layer of the rest of said semiconductor structure, such that a connecting portion between said semiconductor structure beneath said bond pad and the rest of said semiconductor structure is narrower than the bond pad.

2. The LED chip device of claim 1, further comprising at least one current spreading conductor electrically contacting said at least one bond pad and said semiconductor structure.

3. The LED chip device of claim 1, further comprising a passivation layer that covers the sidewalls of said semiconductor structure.

4. The LED chip device of claim 1, said semiconductor structure comprising an n-type layer, a p-type layer, and an active region interposed between said n-type and p-type layers.

5. The LED chip device of claim 4, further comprising a p-contact in electrical contact with said p-type layer and opposite a primary emission surface of said semiconductor structure.

6. The LED chip device of claim 5, further comprising a current blocking layer interposed between said p-contact and said p-type layer beneath said at least one bond pad.

7. The LED chip device of claim 1, wherein said at least one bond pad is substantially circular.

8. The LED chip device of claim 1, wherein said at least one bond pad is substantially rectangular.

9. The LED chip device of claim 1, wherein said at least one trench is backfilled with a filler material.

10. The LED package of claim 1, wherein a primary emission surface of said semiconductor structure is substantially rectangular.

11. The LED chip device of claim 10, said at least one bond pad comprising two bond pads disposed near respective adjacent corners of said primary emission surface, said at least one trench comprising two trenches proximate to the edges of each of said two bond pads.

12. The LED chip device of claim 1, said semiconductor device comprising gallium nitride (GaN) materials.

* * * * *